United States Patent [19]

Morris

[11] 3,989,548
[45] Nov. 2, 1976

[54] ALUMINUM ALLOY PRODUCTS AND METHODS OF PREPARATION

[75] Inventor: Larry Roy Morris, Yarker, Canada

[73] Assignee: Alcan Research and Development Limited, Montreal, Canada

[22] Filed: May 17, 1974

[21] Appl. No.: 471,133

[30] Foreign Application Priority Data
May 17, 1973 United Kingdom............... 23684/73
Mar. 5, 1974 United Kingdom................. 9946/74

[52] U.S. Cl.................................... 148/2; 29/527.7;
75/138; 75/148; 148/11.5 A; 148/32
[51] Int. Cl.²............................................ C22F 1/04
[58] Field of Search............. 75/138, 146, 147, 148;
148/2, 3, 11.5 A, 32, 32.5; 29/527.7

[56] References Cited
UNITED STATES PATENTS

| | | | |
|---|---|---|---|
| 1,945,297 | 1/1934 | Sterner-Rainer...................... | 75/147 |
| 2,170,039 | 8/1939 | Steudel................................. | 75/138 |
| 3,811,846 | 5/1974 | Schoerner et al...................... | 148/2 |
| 3,830,635 | 8/1974 | Chia et al. ............................. | 148/2 |

*Primary Examiner*—R. Dean
*Attorney, Agent, or Firm*—Cooper, Dunham, Clark, Griffin & Moran

[57] ABSTRACT

Dispersion strengthened aluminum alloy products are produced by working a cast aluminum alloy having a content of unaligned intermetallic rods in a selected size range to break up the brittle intermetallic rods. The intermetallic rods form 5.0 – 20 per cent by volume of the alloy and have an average diameter in the range of 0.1 – 1.5 (preferably 0.1 – 0.8) microns.

The working required to effect the necessary segmentation of the rods and dispersion of the resultant intermetallic particles is sufficient to reduce the alloy by at least 60%. Initial hot working is preferably followed by cold working to effect at least a further 10% reduction of the hot worked alloy.

The preferred alloys are alloys of Al-Fe-Mn and Al-Fe-Ni having a composition close to the eutectic and are cast under conditions to avoid as far as possible the formation of coarse primary intermetallic particles.

35 Claims, 10 Drawing Figures

ALUMINUM ALLOY PRODUCTS AND METHODS OF PREPARATION

BACKGROUND OF THE INVENTION

The present invention relates to methods for treating aluminum alloys to achieve dispersion strengthening thereof, and to dispersion-strengthened alloy products obtainable by such methods. The mechanical properties of a dispersion-strengthened alloy product are governed by a fine dispersion of microscopic insoluble particles and/or by the dislocation structure or grain structure resulting from these particles.

Dispersion-strengthened alloy products, including aluminum alloys, have been produced by sintering fine powders. Solid state reaction processes also have been employed to produce dispersion-strenghtened products, such as high-speed steels. Known dispersion-strengthened alloys have useful properties, such as high strength at elevated temperatures.

SUMMARY OF THE INVENTION

The present invention provides a method for producing aluminum alloys, in which a relatively ductile metal is strengthened by a dispersion of relatively hard particles of intermetallic compounds or intermetallic phases. In performance of the method of the invention, individually known casting and fabricating procedures may be employed.

The procedure of the present invention is directed to the production of dispersion-strengthened aluminum alloys by working a cast mass of aluminum, in which brittle rod-like intermetallic phases are present, so as to segment the rod-like phases to form separate particles which are dispersed through the mass. It is found that when intermetallic particles of a size within the range of about 0.1 – 2 microns diameter form from 5.0 to 20 volume per cent of an aluminum alloy, the worked alloy possesses very interesting mechanical properties. The mechanical properties are inferior when the volume fraction falls below 5.0% while the ductility and toughness decline when the volume fraction exceeds 20%. The properties are also adversely affected by the presence of coarse intermetallic particles of a size in excess of 3 microns diameter. The more uniform the dispersion of the intermetallic particles, the better are the mechanical properties of the final product, and for the reason the cast mass of aluminum is most preferably produced under such condition that the areas free of rod-like phases are small.

In one of its broadest aspects, the present invention provides a wrought aluminum alloy product containing from 5.0 to 20 volume per cent of dispersed intermetallic particles in a size range of about 0.1 to about 2 microns and essentially free of coarse primary intermetallic particles.

In another aspect a wrought aluminum alloy product is produced by working a cast aluminum alloy mass containing 5.0 – 20 volume per cent of unaligned intermetallic rods of an average diameter in the range of 0.1 – 1.5 microns, the working being sufficient to reduce the cross-sectional area of the cast aluminum alloy mass by at least 60% to break up the rods into separate particles.

In yet another aspect the present invention contemplates a cast aluminum alloy mass containing 5.0 – 20 per cent by volume of unaligned intermetallic rods having an average diameter in the range of 0.1 – 1.5 microns and essentially free from coarse intermetallic particles.

The intermetallic rods are preferably formed of an intermetallic phase containing aluminum and at least one and usually two of the group consisting of Fe, Ni and Mn. The intermetallic phase may also contain Si. The average diameter of the intermetallic rods is preferably in the range of 0.1 – 0.8 microns.

Further features and advantages of the invention will be apparent from the detailed description hereinbelow set forth, together with the accompanying drawings.

DETAILED DESCRIPTION

Figure 1:
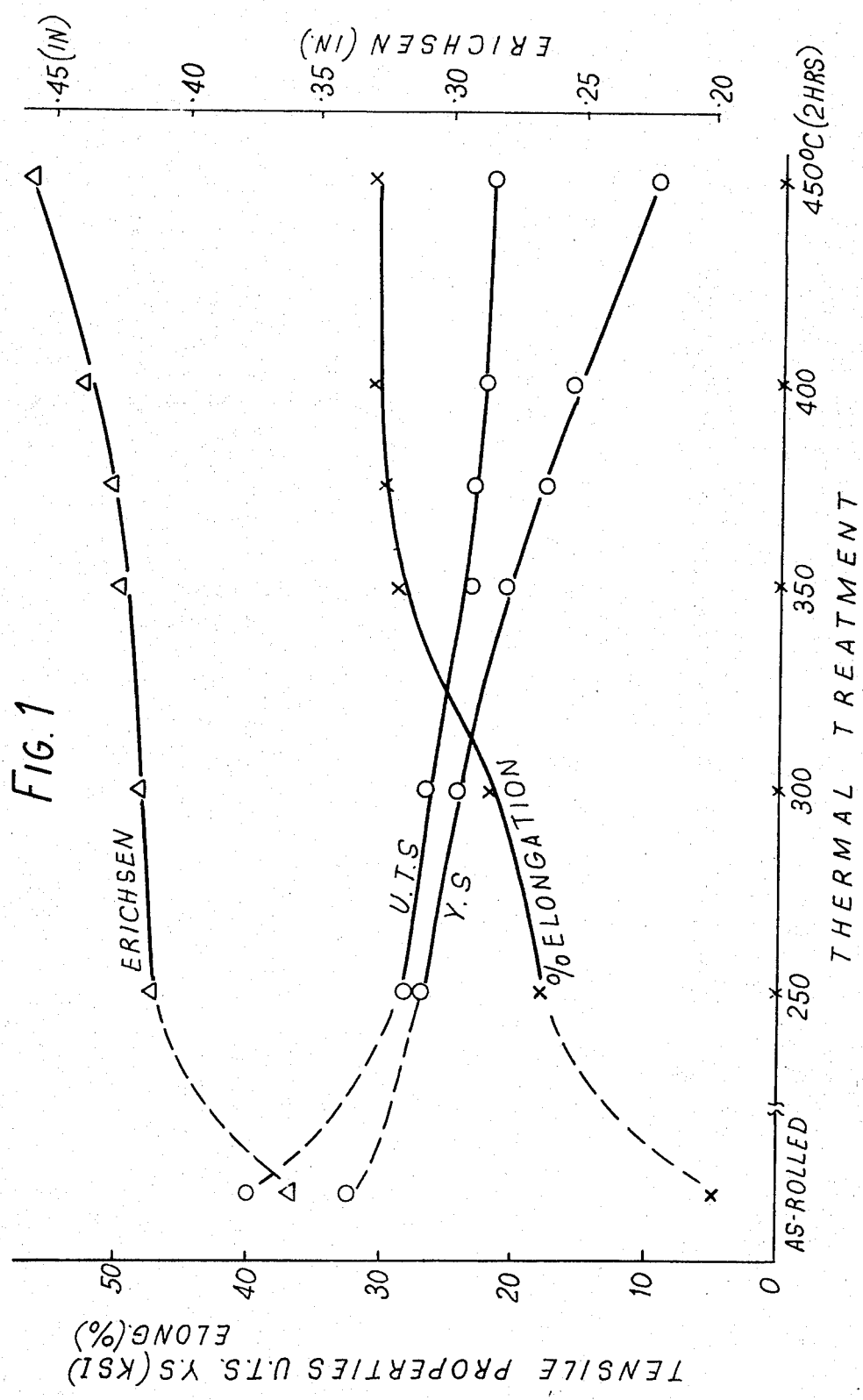
FIG. 1 is a graph relating alloy properties to thermal treatment for an illustrative wrought alloy produced in accordance with the present invention.

The most convenient method for producing rod-like intermetallic phases in an aluminum mass is to cast an eutectic alloy, incorporating alloying elements which form intermetallic phases with aluminum on solidification, under selected casting conditions to produce so-caled "coupled growth." That phenomenon is well known and is explained in an article by J. D. Livingston in *Material Science Engineering*, Vol. 7 (1971), pp. 61 – 70.

It is well known that when a mass of a molten alloy of eutectic or near-eutectic composition is solidified by withdrawing heat so as to set up a temperature gradient toward one end of the mass, aligned lamellae or rods (fibers) of intermetallics may be grown in the metal matrix and that such fibers or lamellae produce a strengthening effect, in particular an increase in tensile strength in the direction of the lamellae or rods.

Lamellar and rod-like eutectic structures are sometimes called "regular" or "normal" eutectics to distinguish them from other structures that solidify from eutectic compositions but with an irregular or faceted structure. It is well known that "regular" eutectics in which the volume fraction of intermetallics is low (less than about 30%) tend to solidify in a rod-like manner, while those with a more equivolume composition grow with a lamellar structure. In some eutectics, a lamellar structure is produced at low growth rates, and a rod-like one at high growth rates. Impurities and the attendant "cellular" or "colony" growth forms tend to promote the formation of a rod-like structure. Cast alloys having a lamellar structure are not of interest in the production of dispersion-strenghtened products by the method of the present invention. The intermetallic phase, described as rodlike, is not necessarily cylindrical in form and may be, for example, hexagonal or rectangular in section with a ratio of major axis to minor axis as high as 5 to 1. The individual rods may be somewhat branched but are essentially of uniform cross section. They are always quite distinct from lamellar-type or coarse irregular structures.

In the known procedures for producing cast masses with rod-like intermetallics, the cooling has most usually been carried out very slowly under conditions arranged to maintain a substantially planar solidification front so as to produce coarse rods (fibers) of intermetallics, all aligned in the casting direction. Numerous fiber-strengthened composites have been produced by slow undirectional soldification of high-purity eutectics. Those materials are very anisotropic, and the strengthening effect of the intermetallic phases is mainly to be found in the direction of the rods. While these materials are expensive to make because of the slow cooling rate and high purity of the metallic ingredients required to develop the desired aligned rods, they also suffer from the disadvantage of being brittle, as they fail by reason of brittle fracture or delamination of the coarse intermetallic phases. While fiber-reinforced cast metals have been the subject of extensive laboratory studies, the methods of production employed have required so much care and have so slow that the products have been of only limited commercial interest.

As opposed to the fiber-strengthened composites already proposed, there is in the present invention no requirement that the rod-like phases should be aligned with the axis of the cast mass. Indeed it is preferable that they should be unaligned. In consequence there is no requirement, in producing cast ingots for use in the procedure of the present invention, that the solidification front should be substantially planar. In consequence, it becomes possible to produce the ingots by conventional direct chill continuous casting under conditions selected to ensure coupled growth of the intermetallic phase in rods of the required diameter in the matrix composed of the more ductile aluminum. Very satisfactory dispersion strengthened products can be achieved provided that the cast mass is produced in such a manner that the intermetallic phase grows in the form of fine closely spaced rods of an average diameter in the range of 0.1 – 1.5 microns, so that they may be broken up by subsequent working to produce a uniform dispersion of fine intermetallic particles.

In the cast mass, the average rod center-to-center spacing is preferably not more than one micron with the object that in the final product the average interparticle spacing is very small, the particles themselves being on an average no more than 2 microns and preferably 0.2 – 1 micron in diameter. A method of determining average particle diameter is explained below.

That is to say, it is found that attainment of desired properties is dependent on average particle diameter as hereinafter defined, and in accordance with present theoretical understanding, this relationship may be explained in terms of interparticle spacing. In the wrought products, the particle diameter of the dispersed intermetallic phase should be sufficiently small to enable the distance between a particle and its nearest neighbor to be 3 microns or smaller so that the particles will generate and stabilize a dislocation cell structure of that magnitude during cold deformation, or hold a grain diameter of that magnitude after annealing. If the particle diameter is so large that this interparticle spacing on average exceeds about 3 microns, the strength is progressively reduced to levels that are of little commercial interest. If the particles are too small (less than about 0.1 micron), they will not hold high angle msorientation boundaries in the aluminum matrix and the material will behave similarly to standard alloys, in which the solid particles are precipitated from solid solution by heat treatment. By contrast with the particles formed by the disintegration of the rod-like phase, the particles precipitated in a normal heat treatment are below 0.1 micron diameter. If the intermetallic particles are too large or unevenly distributed in the products made from eutectic alloys with rod-like intermetallic phases, they will act as sites for stress concentrations or as paths for crack propagation and the material will lose its toughness or formability; also the yield strength and recrystallization temperature will be reduced. For the same reason, coarse intermetallic primary particles are undesirable.

The alloys so far considered as possessing the major interest for commercial exploitation because of the strength and formability of the end product have 5.0 – 12 volume per cent intermetallics.

While an average particle diameter ranging between 0.1 and 2 microns may confer satisfactory properties in the end product, as already stated an average particle diameter in the range of 0.2 to 1.0 micron is preferred. The average particle diameter is determined by counting the number of particles present in unit area in a micrograph of a cross section, ignoring coarse primary intermetallic particles and fine particles that are precipitated from solid solution. Such particles are easily recognizable by an experienced metallurgist.

The average particle diameter is then given by the following formula:

$$d = 0.90 \sqrt[3]{V} / \sqrt{N_p}$$

where:
  $d$ = particle diameter
  $N_p$ = number of particles per unit area
  $V$ = volume fraction of intermetallics (0.05 to 0.20)

The above formula expresses the size of the particles in terms of the diameter of a sphere of equal volume. The diameter of an enlongated particle formed by segmenting a cylindrical rod is, when expressed in these terms, usually larger than the diameter of the rod from which it formed.

Since there is no requirement for the coupled phases to be aligned in a single direction, it is unnecessary to suppress the formation of eutectic cellular growth (caused by the segregation of impurities) and therefore commercial purity aluminum metal can be used for the production of the cast alloy. This cellular or "colony" mode of solidification produces unaligned intermetallic rods. In producing the cast alloy, the metal should be cast under such conditions that substantialy no nucleation of intermetallics occurs in the molten metal in advance of the front between the liquid metal and solid metal. Up to about 2% by volume of coarse primary intermetallic particles may be tolerated, but complete absence of such particles is greatly preferred. However, where the volume of coarse primary intermetallic particles is below 2% the cast alloy is considered to be essentially free of such particles for the purposes of the present invention. In order to achieve the requirement for suppression of the growth of primary particles, it is found that there must be a temperature gradient of at least 5° C/cm. in the molten metal in the immediate vicinity of the solidification front. It is possible, when suitable control of the temperature gradient in the region of the solidification front is exercised, to achieve the desired result of producing the cast aluminum alloy with no more than 2% by volume of primary intermetallic particles (as opposed to rods) from molten metal in which the alloying elements exceed the eutectic by as much as 10%.

In order to achieve the preferred intermetallic rod spacing of 1 micron or less, it is found that the growth rate (rate of deposition of solid metal in a direction substantially perpendicular to the solidification front) must be at least 1 cm/minutes. Thus it will be seen that the requirements of the casting procedure are such that, as already stated, ingots having the desired characteristics may be produced by the conventional direct-chill continuous casting process in which coolant is applied direct to the surface of the ingot as it emerges from an open-ended mold and this is in marked contrast with the very slow and undirectional growth requirements of the coarse fiber-reinforced composites previously described. The direct-chill continuous casting process, particularly when employing a hot-top mold in conjunction with a glass-cloth distributor, permits the maintenance of relatively stable conditions in the vicinity of the solidification front, while applying a heavy chill to the soldified metal by the application of coolant to the surfce of the ingot emerging from the mold and at the same time introducing fresh molten metal to the mold. This enables the desired high growth rate to be achieved in conjunction with the necessary steep thermal gradient required for coupled growth of metal matrix and intermetallic phase without formation of coarse primary intermetallic particles.

The term "eutectic composition" is used herein to mean binary, ternary, and higher order eutectic compositions as well as a range of compositions near these eutectics over which it is possible to obtain the simultaneous deposition of the ductile metallic aluminum phase and one or more rod-like intermetallic phases. Also included in "eutectic compositions" are compositions that approximate the boundaries between phase fields that are eutectic in character, for example, a monovariant alloy, i.e. an alloy that solidifies by a monovariant eutectic reaction. In general it may be stated that the desired rod-like intermetallic phase may be produced without excessive growth of coarse primary intermetallic particles or excessive growth of primary aluminum dendrites in "eutectic compositions" in which the toal content of principal alloying elements is less than 10% above or 20% below the total content of these elements at the eutectic or eutectic trough.

It is, however, preferred that the content of alloying elements should be 90 – 100% of that required for the eutectic. If the alloying element additions are less than the eutectic composition, then primary aluminum dendrites are formed (in addition to the desired eutectic structure). In this case, the microstructure will consist of aluminum dendrite cells, essentially free of intermetallic phases, and the rod-like eutectic structure which will form at the boundaries of the dendrite cells. The presence of large areas free of intermetallic rods will obviously tend to reduce the uniformity of the particle dispersion when the cast alloy is rolled or otherwise deformed to break up and disperse the brittle intermetallic phase. For a given growth rate the completely coupled growth structure is optimum; however, the presence of aluminum dendrites is quite acceptable providing that the average intermetallic particle size and spacing, after working, is as already specified. It is, of course, apparent that the finer the dendrite cells, i.e. the faster the rate of growth, the more aluminum dendrite volume can be tolerated to arrive at the required structure in the end product. In some circumstances, as much as 50 – 60% by volume of aluminum dendrites is tolerable in relatively thick ingots cast by direct-chill continuous casting procedure, but the properties of rolled products decrease progressively with increase in volume of the dendrites. In casting thin material, i.e. up to about 1 inch thick, where exceptionally high chill rates can be achieved, even higher percentages of aluminum dendrites of very small size (of the order of $5\mu$) are acceptable and provided the dendrites are sufficiently small the mechanical properties are not very adversely affected.

When the cast alloy is deformed by rolling or extrusion, the intermetallic rods are not fractured haphazardly but tend to segment evenly along their length, creating uniform but somewhat elongated particles whose diameter corresponds to the diameter of the original intermetallic rods. These particles tend to disperse themselves evenly throughout the ductile metal matrix during the subsequent deformation of the ingot. Since the particles are small in size, take up a small volume fraction, and are uniformly distributed in the matrix, they do not adversely affect the toughness or formability of the material. The aspect ratio (ratio of length to diameter) of the majority of particles formed by the disintegration of the intermetallic rods falls in the range of 1:1 to 5:1. By contrast, the average length of the rod-like intermetallics in the cast alloy is usually substantially more than 100 times the diameter.

The properties of rolled products produed by the method of the present invention are to some extent anisotropic. It is preferred to reduce the relative proportions of the anisotropy by introducing small proportions of Cu and/or Mg, which remain in solid solution in the Al phase and have known strength providing properties.

In the production of rolled products of good formability for such purposes as automobile body pressings, it is permissible to sacrifice some of the potential strength of the product in order to ensure the desired formability characteristics and in certain cases in order to ease the production of sound, crack-free ingots in the initial casting stage. For this reason and to minimize the formation of coarse primary intermetallic particles in the production of rolled products by the method of the present invention, it is preferred that the total content of principal alloying elements should be somewhat less (between 90 – 100%) than that required for an eutectic.

In the production of dispersion-strengthened aluminum alloys, the invention is most generally applicable to "eutectic compositions" in which the alloying constituents are two or more selected from the group consisting of Fe in an amount of at least 1.2%, Ni in an amount of at least 1.1%, Mn in an amount of at least 0.3%, and Si in an amount of at least 0.5%, such principal alloying constituents being present in a total amount to supply from 5.0 to 20 percent by volume of intermetallic phases; the alloy may also contain such quantities of other elements as do not destroy the potentiality for the growth of fine rod-like intermetallic phases. A most particular application of the invention is to the production of novel Al-Fe-Mn and Al-Fe-Ni dispersion-strengthened wrought products, formed by working cast masses of "eutectic compositions," which have been produced under the necessary conditions to grow the intermetallic phase in the form of rods of appropriate size (and hence of appropriate spacing). In the casting of alloys containing both Fe and Ni as principal alloying elements, up to 0.5% of the total Fe and Ni content may be replaced by an equal amount of Co.

Having produced a cast alloy of the necessary structure, the breakdown of the brittle intermetallic phase into dispersed particles may be achieved by either hot and/or cold working the cast alloy in a variety of ways. A reduction of at least 60% is required for the necessary dispersion of the particles formed by the breakdown of the intermetallic rods. While care must be taken that time/temperature conditions selected for the preliminary heating of the ingot before hot working do not result in the coalescence of te intermettalics, there is little difficulty in the selection of satisfactory conditions. For example, for Al-Fe-Mn and Al-Fe-Ni eutectics, the ingot may be heated to a temperature of 500° C for 1 hour before hot working.

In the production of rolled products, it is preferred to perform the major part of the reduction of the initial ingot by hot-rolling, but it is also preferable to apply a subsequent cold-rolling operation to achieve at least a further 10% reduction and preferably at least 50% reduction of the hot-rolled slab to generate the desired dislocation cell structure in the aluminum matrix. By the term "cold-working" it should be understood that the alloy has been subjected to working at a temperature below about 250° C.

The alloy, which has been deformed by cold-working can be held at 200° C (or higher) to produce recovery or recrystallization. Even when a subsequent processing operation, such as porcelain enamelling or brazing, results in recrystallization in the cold-worked material, relatively high properties will still be retained. A very fine grain or subgrain size, which will result from such a treatment, makes an important contribution to the mechanical properties of the material.

The invention is particularly applicable to the production of rolled sheet throughout the conventional thickness range of 0.1 – 0.0004 inches.

One particular field to which the invention is particularly applicable is in the production of aluminum alloy sheet of relatively low cost, in terms of alloying constituents, and having good formability and higher strength after elevated temperature treatments, such as enamelling and brazing, than those alloys conventionally employed for that purpose at the present time. This improved sheet is based on the above-mentioned Al-Fe-Mn and Al-Fe-Ni eutectic compositions. These alloys with possible additions of Mg and/or Cu and/or, in the case of the Al-Fe-Ni alloy, of Mn, when subjected to a final thermal treatment at a temperature in the range of 230° – 450° C after cold working, lead to a rolled product having excellent formability in relation to its mechanical strength properties being obtained.

For products such as automobile body pressings, it is highly desirable for aluminum sheet to exhibit the following minimum combination of properties:

| | |
|---|---|
| 0.2% yield strength: | 20 ksi |
| Elongation on 2-inch gauge length: | 20% |
| Erichsen cup test: | 0.40 inch |

The Erichsen test is a cupping test in which a piece of sheet metal, restrained except at the center, is deformed by a cone-shaped spherical-end plunger until fracture occurs. The height of the cup in millimeters (or inches) at fracture is a measure of the ductility.

The test is described in the British Standards Institution B.S. 3855: 1965: entitled "Method for Modified Erichsen Cupping Test for Sheet and Strip Metal."

The preferred eutectic composition for the Al-Fe-Mn alloy has an Fe and Mn content lying within the coordinates 1.9% Fe, 0.3% Mn; 2.0% Fe, 0.8% Mn; 1.4% Fe, 1.2% Mn; 1.4% Fe, 0.6% Mn, the alloy also including Zn, Li, Cu, Mg, Si up to 1.5% total and up to 1.0% max. each; others up to 1.0% max. total and up to 0.3% each, balance Al. It is however, most preferred that the alloy should contain Fe and Mn within the coordinates 1.8% Fe, 0.6% Mn; 1.8% Fe, 0.8% Mn; 1.5% Fe, 1.0% Mn; 1.5% Fe, 0.7% Mn, the alloy also containing Cu 0.1 – 0.3% and Si up to 0.3%, others preferably below 0.15% total (0.1% max. each), balance Al. All compositions falling within both the wider and narrower range of Fe and Mn contents quoted above are within 10% more than or 20% below a eutectic composition.

In the case of Al-Fe-Ni base alloy, the preferred Fe and Ni content lies within the coordinates 1.9% Fe, 1.1% Ni; 1.9% Fe, 1.8% Ni; 1.5% Fe, 2.5% Ni; 1.2% Fe, 2.5% Ni; 1.2% Fe, 1.2% Ni, the alloy also containing Mn up to 1.5%, Zn, Cu, Li, Mg, Si, up to 1.5% total, up to 1.0% max. each, others up to 1.0% max. total and up to 0.3% each, balance Al. The most preferred composition has an Fe and Ni content within the coordinates 1.7% Fe, 1.2% Ni; 1.8% Fe, 1.7% Ni; 1.4% Fe, 2.3% Ni; 1.4% Fe, 1.2% Ni, the alloy also containing Mn 0.3 – 0.6%, Cu up to 0.5%, Mg up to 0.5%, Si up to 0.3%, others up to 0.15% total and up to 0.1% each, balance Al. Up to 0.5% Co may be substituted for an equivalent part of the Fe and/or Ni content, but the relatively high cost of Co makes it unlikely that this would be employed in commercial practice.

The structure of the ingot of an Al-Fe-Mn eutectic composition, when solidified at growth rates greater than about 1 cm/minute with temperature gradients in the liquid greater than about 5° C/cm, consists of a cellular "eutectic" structure containing fine rods of the $(Fe,Mn)Al_6$ phase with an average diameter of less than one micron. In large ingots, cast by the direct-chill continuous casting process, the growth rates vary from center to edge and the temperature gradients in the liquid are not well defined and are reduced by convective mixing in the molten ingot sump. Nevertheless, it has been found possible to cast an ingot with the required structure by the direct-chill continuous casting process, pouring the alloy at 75°–100° C above its melting point and using a mold equipped with a hot-top and a glass-cloth screen distributor designed to reduce forced and natural convection in the molten metal sump in the ingot during casting.

When an ingot having the proper structure is hot-rolled or extruded, the rod-like (Fe,Mn)Al$_6$ phase is broken up into a fine uniform dispersion of particles in the aluminum matrix. When this material is cold-worked the strength of the material is increased and some of the increased strength is retained even after subsequent recovery or recrystallization, because of the very fine grain or sub-grain size that is stabilized by the intermetallic dispersion.

Many other eutectic compositions may be employed for the production of dispersion-strengthened products by the method of the present invention. One further example of such eutectic composition which may be cast and processed by the procedure set forth is an Al-Fe-Mn-Si alloy. A preferred composition of such an alloy is 1.4 – 2.2% Fe; 0.5 – 2.0% Si; 0.1 – 1.0% Mn; up to 1.5% total (1.0% max. each) Zn, Cu, Li, Mg; up to 1.0% total (0.3% max. each) others; balance Al. A most preferred range is 1.7 – 2.0% Fe, 0.5 – 1.0% Si, 0.5 – 0.9% Mn, up to 0.3% Cu, up to 0.3% Mg, up to 0.15% total (0.1% max. each) others, balance Al.

Another example of a suitable eutectic composition is an Al-Ni-Mn eutectic composition containing 4.5 – 6.5% Ni and 0.3 – 2.5% Mn. Zn, Cu, Li, Mg, Fe and Si are permissible in amounts up to 1.5% total and 1.0% each. The principal alloying elements Ni and Mn are preferably held within the ranges 5.5 – 6.0% Ni and 1.0 – 2.0% Mn. Preferably Cu, Mg, Fe and Si are held below 0.3% each. Other elements are held below 1.0% (preferably below 0.15%) total and below 0.3% (preferably below 0.1%) each.

Another example of a suitable eutectic composition is an Al-Fe-Si eutectic. A suitable composition is about 1.8% Fe and about 3% Si. While it is permissible to include up to 1.5% total (1.0% max. each) Zn, Cu, Li, Mg, Mn, up to 1.0% total (0.3% max. each) others, it is preferred to maintain the following maxima for additional alloying elements: up to 0.5% Cu, up to 0.5% Mg, up to 0.5% Mn, up to 0.15% total (0.1% max. each) others.

A further example is an Al-Mn-Si eutectic composition. A suitable composition contains about 2% Mn and about 2% Si. While it is permissible to include up to 1.5% total (1.0% max. each), Zn, Cu, Li, Mg, Fe, up to 1.0% total (0.3% max. each) others, it is preferred to maintain the following maxima for additional alloying elements: up to 0.5% Cu, up to 0.5% Mg, up to 0.5% Fe, up to 1.0% total (0.3% max. each) others.

In the following examples, Examples 1 to 3 describe tests carried out to establish the advantages arising from the process of the present invention in relation to the abovequoted aluminum-iron-manganese eutectic composition and are designed to illustrate (1) the effect of structure, (2) results of production trials, (3) the influence of modifications on the base alloy.

EXAMPLE 1

Effect of Structure on Tensile properties

| | |
|---|---|
| Composition: | 1.8% Fe - 1.0% Mn - 0.1% Si - others <0.01% each - balance Al. |
| Casting procedure: | Ingot A - 1¼ in. diameter grown from water chill base. The intermetallic (Fe,Mn)Al$_6$ phase was present in the form of rods of about ½ micron diameter. |
| | Ingot B - cast as 1¼ in. thick ingot in iron chill mold. The intermetallic phase is in the form of coarse particles up to 10 microns in size and irregularly distributed. |
| Processing: | Both ingots heated to 500° C for 1 hour; hot rolled to 0.15 in.; cold rolled to 0.05 in. sheet. |

Tensile specimens were cut from the sheet and annealed for 100 hours at the temperatures shown in Table 1.

Table 1

Effect of Structure on Tensile Properties* of Al-1.8% Fe-1.0% Mn alloy

| Ingot | Cold Rolled (67%) Ult. ksi | Yield** ksi | El.*** | 300° C—100 hrs. Ult. ksi | Yield ksi | El. | 400° C—100 hrs. Ult. ksi | Yield ksi | El. | 500° —100 hrs. Ult. ksi | Yield ksi | El. |
|---|---|---|---|---|---|---|---|---|---|---|---|---|
| A | 43 | 31 | 4% | 26 | 25 | 23% | 22 | 18 | 32% | 24 | 17 | 29% |
| B | 26.5 | 22.5 | 11% | 18.5 | 11.5 | 30% | 17 | 7 | 40% | 16 | 6.5 | 40% |

*Tensile properties in this and other tables are in longitudinal direction unless otherwise stated.
**Yield strength in this and other tables is expressed as 0.2% yield strength.
***Elongation in this and other tables is expressed as a percentage elongation on a 1 inch or 2 inch gauge length.

The tensile properties of sheet rolled from ingot B are similar to those of conventional AA-3003 sheet. The very marked advantage of the properties of the sheet obtained from ingot A over sheet obtained from ingot B is obvious from the above figures.

EXAMPLE 2

Trial with D.C. (Direct-Chill) Ingot

| | | |
|---|---|---|
| Composition: | 1.65% Fe - 0.95% Mn - 0.09% Si - others <0.01% each - balance Al. | |
| Casting procedure: | 5 in. × 20 in. D.C. ingot cast at 3 in./min.; 1 in. mold length (using hot top); glass cloth screen around metal level controlling float at end of dip tube, through which metal enters mold; metal temperature 725° C. | |
| Processing: | Ingot preheated to 500° C and hot-rolled to 0.26 in. and: | |
| | Schedule (1) | Hot-rolled slab cold-rolled to 0.15 in.; annealed at 400° C for 1 hr.; then cold-rolled to 0.05 in. sheet. |
| | Schedule (2) | Partially annealed at 250° C for 1 hr. between repeated 15% reductions by cold-rolling to 0.05 in. |

Table 2
Tensile Properties of Sheet Rolled from D.C. Ingot

| | Cold-Rolled | | | Annealed 200° C | | | Annealed 300° C | | | Annealed 400° C | | |
|---|---|---|---|---|---|---|---|---|---|---|---|---|
| | Ult. ksi | Yield ksi | El. | Ult. ksi | Yield ksi | El. | Ult. ksi | Yield ksi | El. | Ult. ksi | Yield ksi | El. |
| 1) | 34 | 27 | 8% | 29 | 28 | 7.5% | 25 | 24 | 15% | 22 | 17 | 30% |
| 2) | 38 | 31 | 10% | 30 | 29 | 13% | 27 | 25 | 23% | — | — | — |

Examination of the structure of the as-cast ingot indicated that the intermetallic phase $(Fe,Mn)Al_6$ was present in the form of rods of about ½ micron diameter in the metal matrix.

After the ingot had been subjected to processing by hot-rolling and cold-rolling, examination of the sheet showed that the intermetallic phase had been broken up into a uniform dispersion of fine particles of the order of 0.7 micron in average diameter.

EXAMPLE 3

Effect of Other Elements

| Composition: | 1.7% Fe - 1.0% Mn - 0.1% Si - others <0.01% each - balance Al plus additions as indicated. |
|---|---|
| Casting procedure: | 1¼ in. diameter ingot as Ingot A in Example 1. |
| Processing: | As in Example 1. |

Table 3
Effect of Added Elements on Tensile Properties of 0.05 in. Sheet

| | Cold-Rolled (67%) | | | Annealed 300° C—100 hrs. | | |
|---|---|---|---|---|---|---|
| alloy | Ult. ksi | Yield ksi | El. | Ult. ksi | Yield ksi | El. |
| Base alloy | 37 | 31 | 6% | 25 | 23 | 23% |
| + 0.2% Cu | 42 | 34 | 6% | 28 | 24 | 24% |
| + 0.3% Mg | 48 | 39 | 4% | 29 | 24 | 20% |

Examination of the structures of the ingots and of the rolled products indicated a virtually identical structure to that obtained in the case of Ingot A of Example 1. The additions of Cu and Mg did not interfere with the growth of the rod-like $(Fe,Mn)Al_6$ phase.

Further examples are given below of the properties obtained when certain binary and higher order eutectics are submitted to the process of the present invention.

EXAMPLE 4

| Alloy: | Aluminum 6.3% Ni (plus about 0.2% impurities) |
|---|---|
| Casting procedure: | 9 × 3½ in. D.C. ingot cast at 6 in./min. |

Mechanical properties*

(a) Ingot preheated to 525° C and hot-rolled to ¼ in. slab.

| Sample | Ult.* ksi | Yield* ksi | El.* % | Notch Strength Efficiency %** Ult. | Yield |
|---|---|---|---|---|---|
| Longitudinal | 38.3 | 33.3 | 7.8 | 87 | 100 |
| Transverse | 33.4 | 27.5 | 6.5 | 96 | 117 |

(b) ¼ in. hot-rolled slab cold-rolled to 0.050 in. sheet.

| Longitudinal | 42.2 | 34.4 | 5.8 | 85 | 115 |
|---|---|---|---|---|---|
| Transverse | 38.0 | 28.3 | 4.5 | 72 | 88 |

*Averages of 3 values from standard tensile specimens
**Notch strength efficiency from Kahn tear test

EXAMPLE 5

| Composition: | A 5.5% Ni - 0.95% Mn - Balance Al (99.8% purity) |
|---|---|
| | B 6.0% Ni - 2.0% Mn - Balance Al (99.8% purity) |
| Casting procedure: | 5 in. × 20 in. D.C. ingot cast by the procedure of Example 2 |
| Processing: | As in Example 2 |
| Tensile properties: | 0.050 in. sheet. |

| | Cold-Rolled | | | Annealed 300° C—100 hrs. | | |
|---|---|---|---|---|---|---|
| Schedule (1) | Ult. ksi | Yield ksi | El. | Ult. ksi | Yield ksi | El. |
| Alloy A | 46 | 36 | 8% | 37 | 37 | 6% |
| Alloy B | 53 | 39 | 5% | 47 | 46 | 3% |
| Schedule (2) | | | | | | |
| Alloy A | 47 | 36 | 10% | 39 | 39 | 8% |
| Alloy B | 53 | 42 | 5% | 48 | 46 | 4% |

EXAMPLE 6

| Composition: | A 1.5% Fe - 0.0% Mn - 2.0% Ni - 0.1% Si - others < 0.01% each - Balance Al |
|---|---|
| | B 1.5% Fe - 0.5% Mn - 2.0% Ni - 0.1% Si - others < 0.01% each - Balance Al |
| | C 1.5% Fe - 1.0% Mn - 2.2% Ni - 0.1% Si - others < 0.01% each - Balance Al |
| Casting procedure: | 1¼ in. diameter ingot as Ingot A in Example 1. |
| Processing: | As in Example 1 |
| Tensile properties: | 0.050 in. sheet. |

| | Cold-Rolled | | | Annealed 300° C—100 hrs. | | |
|---|---|---|---|---|---|---|
| | Ult. ksi | Yield ksi | El. Pct | Ult. ksi | Yield ksi | El. Pct |
| Alloy A | 39 | 31 | 10 | 29 | 28 | 25 |
| Alloy B | 43 | 35 | 8 | 35 | 35 | 7 |
| Alloy C | 45 | 37 | 7 | 35 | 33 | 8 |

In this example in the case of Alloy B the average particle diameter in the rolled sheet was 0.5 microns (2 microns maximum).

EXAMPLE 7

This example shows the variation in mechanical properties obtained by the addition of copper, copper and manganese, and magnesium to an Al-Fe-Ni alloy of the type of Example 6.

| Composition: | A 1.6% Fe - 1.8% Ni - 0.6% Cu (others less than 0.1% each, 0.2% total) |
|---|---|
| | B 1.5% Fe - 1.9% Ni - 0.6% Cu - 0.6% Mn (others less than 0.1% |

-continued

```
                        each, less than 0.2% total)
                  C  1.7% Fe - 1.7% Ni - 0.3% Mg
                        (others less than 0.1% each,
                        less than 0.2% total)
Casting procedure:  3¾ in. × 9 in. D.C. ingot, using
                    hot top, 730° C metal temperature,
                    speed 4 in./min.
Processing:         Ingot scalped; preheated to 500° C,
                    hot-rolled to 0.125 in., cold rolled
                    to 0.040 in., final partial anneal
                    at 350° C for 2 hours.
```

Mechanical Properties of 0.040 inch sheet

| Alloy | U.T.S. (ksi) | Y.S. (ksi) | Elongation (%) | Erichsen (in.) |
|---|---|---|---|---|
| A | 31 | 24 | 18 | 0.36 |
| B | 32 | 20 | 19 | 0.34 |
| C | 29 | 27 | 19 | 0.33 |

EXAMPLE 8

Sheet Produced from Al-Fe-Mn-Si Alloys

```
Composition:        A  1.8% Fe - 0.8% Mn - 0.5% Si
                        (others less than 0.1% each,
                        less than 0.2% total)
                    B  2.0% Fe - 0.8% Mn - 1.0% Si
                        (others less than 0.1% each,
                        less than 0.2% total)
                    C  2.1% Fe - 0.5% Mn - 1.7% Si
                        (others less than 0.1% each,
                        less than 0.2% total)
Casting procedure:  1¼ in. diameter ingot, growth rate
                    4 in./min.
Processing:         Ingots preheated to 500° C and hot-
                    rolled to 0.375 inch. Cold rolled
                    to 0.050 inch.
Structure:          Ingot - coupled growth, fine rods of
                    alpha-Al-Fe-Mn-Si
                    Sheet - fine particles less than 1
                    micron in average diameter.
```

Tensile properties

| | As-Rolled | | | Annealed 300° C—100 hrs. | | |
|---|---|---|---|---|---|---|
| Alloy | U.T.S. (ksi) | Y.S. (ksi) | El. % | U.T.S. (ksi) | Y.S. (ksi) | El. % |
| A | 36 | 28 | 7 | 21 | 16 | 32 |
| B | 38 | 29 | 5 | 22 | 15 | 23 |
| C | 36 | 25 | 7 | 19 | 9 | 26 |

Examination of the ingots in the as-cast state and examination of the products produced by rolling in each of Examples 4 to 8 showed that these had similar structures to those stated for ingot A in Example 1.

Figure 2:
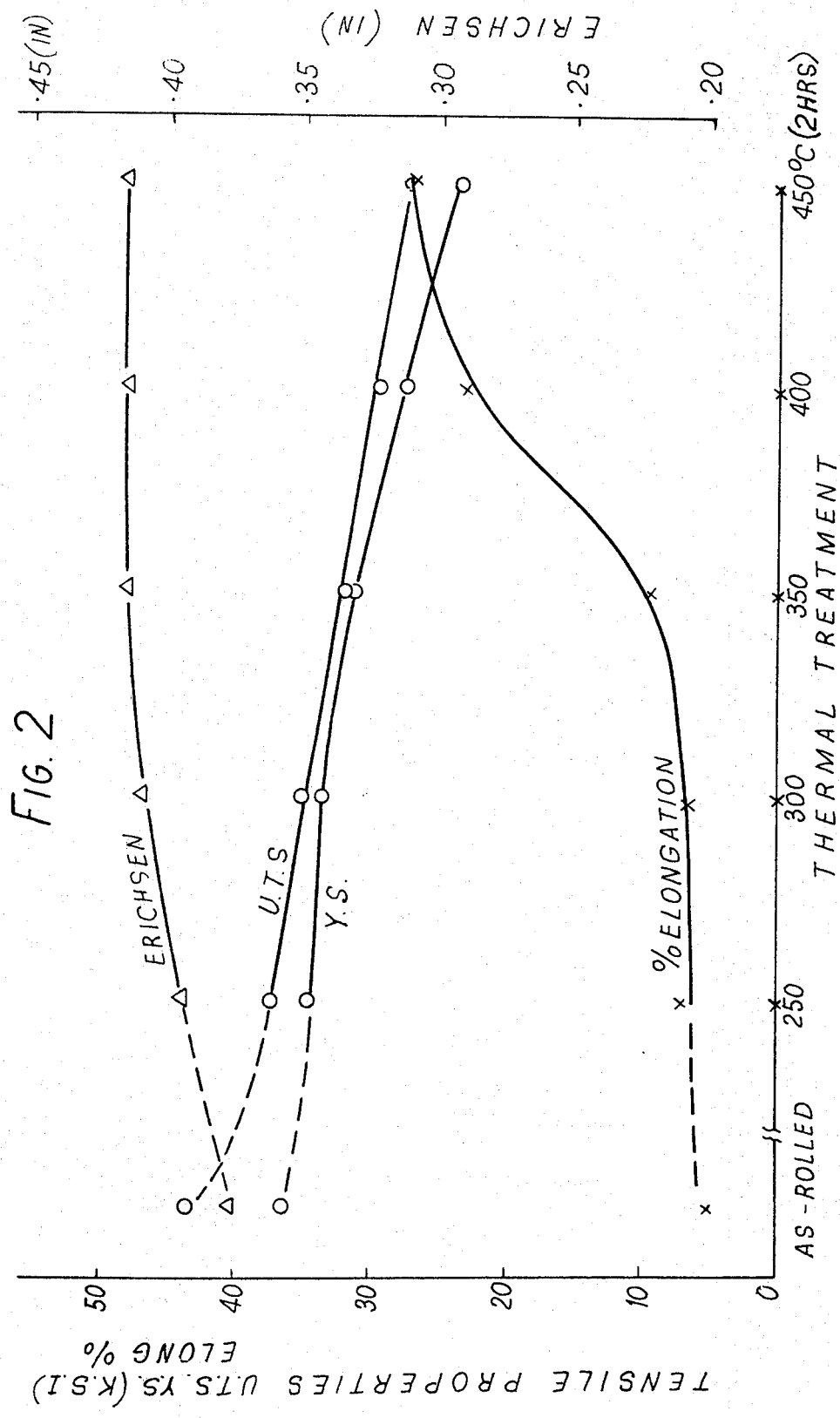
FIG. 2 is a graph similar to FIG. 1 for another alloy produced in accordance with the invention.

An indication of how final thermal treatments of 2 hours, at various temperatures over the range 250 to 450° C, affect the properties of an Al — 1.65% Fe, 0.91% Mn, 0.20% Cu, (the alloy of Example 2 with 0.2% Cu added), and an Al — 1.6% Fe, 1.9% Ni, 0.5% Mn alloy (similar to Composition B of Example 6) is given in the enclosed FIGS. 1 and 2, respectively. In general, the material prior to being given the indicated thermal treatment has been cast as 5 in. × 20 in. D.C. ingot, scalped, reheated to 500° C and hot rolled to ¼ inch, cold rolled to 0.150 inch, interannealed 2 hours at 350° C, and cold rolled to 0.050 inch sheet. From these figures, it will be noted that final treatment temperatures of about 350° C give the desired combination of properties for the Al-Fe-Mn alloy while temperatures of about 400° C are preferred for the Al-Fe-Ni-Mn alloy.

All percentages herein stated with reference to alloy compositions are percentages by weight.

The invention is further illustrated by reference to photomicrographs forming FIGS. 3 to 6.

Figure 3:
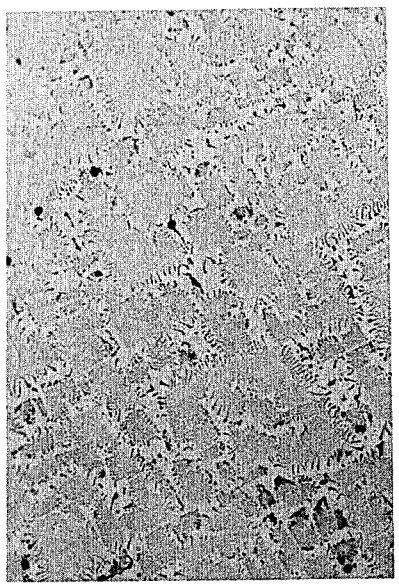
FIG. 3 is a photomicrograph showing the structure of a cast ingot of an exemplary alloy, illustrating a stage in performance of the present process.

FIG. 3 is a photomicrograph at a magnification of 500 × of an ingot of 1.8% Fe, 0.8% Mn, balance Al (commercial purity) and cast under the conditions stated in Example 2.

Figure 4:
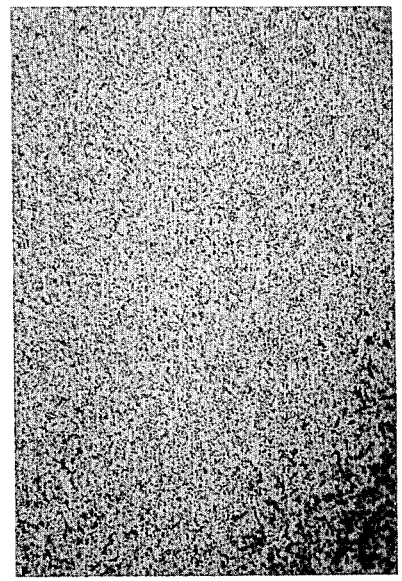
FIG. 4 is a photomicrograph of a sheet produced by rolling the ingot of FIG. 3 in accordance with the present invention.

FIG. 4 is a photomicrograph at a magnification of 500 × of a sheet of 0.050 inch thickness produced by rolling the ingot of FIG. 3.

Figure 5:
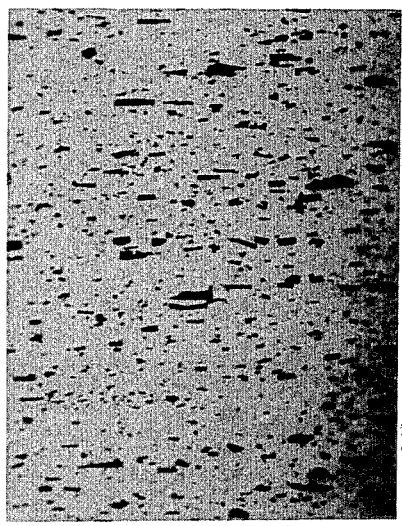
FIG. 5 is a photomicrograph of a sheet produced from an ingot of the same alloy as that of FIG. 3 but cast under conditions resulting in heavy formation of coarse intermetallic particles.

FIG. 5, by contrast, illustrates the structure at the same magnification of a sheet formed from the same alloy, but from an ingot cast under such conditions that there was heavy formation of coarse intermetallic particles.

Figure 6:
FIG. 6 is a photomicrograph of a rolled sheet of another alloy produced in accordance with the invention.

FIG. 6 is a transmission electron micrograph at a magnification of 13000 × of a rolled and partially annealed sheet formed from Al, 6% Ni eutectic composition and showing somewhat elongated particles of $NiAl_3$.

Figure 7:
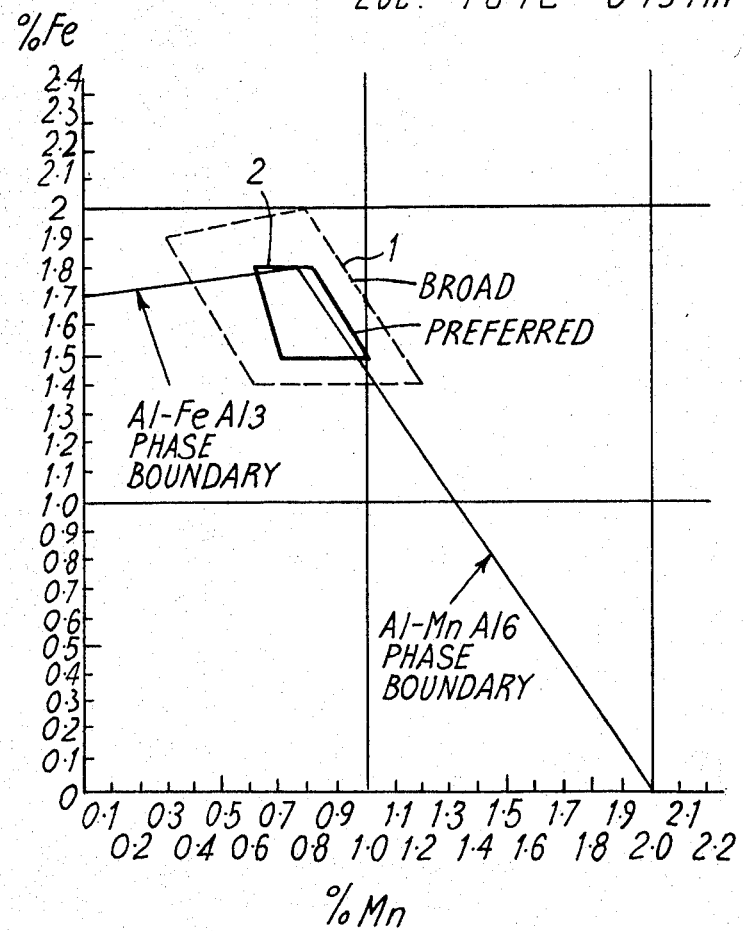
FIG. 7 is a graph illustrating the liquidus boundaries between Al, $FeAl_3$ and Al, $MnAl_6$.

In order to further illustrate the invention, reference is made to the accompanying FIG. 7, which shows in simplified form the liquidus boundaries between Al,- $FeAl_3$ and Al,$MnAl_6$. The area indicated by the outer solid line 1 defines a general range of eutectic compositions which may conveniently be employed for the production of cast alloys having rod-like intermetallic phases of the required diameter for use in the production of dispersion-strengthened wrought aluminum alloy products of the present invention. The area indicated by the inner solid line 2 defines a preferred range of compositions with which cast alloys having the desired rod-like phases may be more easily produced without growth of undesirable coarse intermetallic particles.

Figure 8:
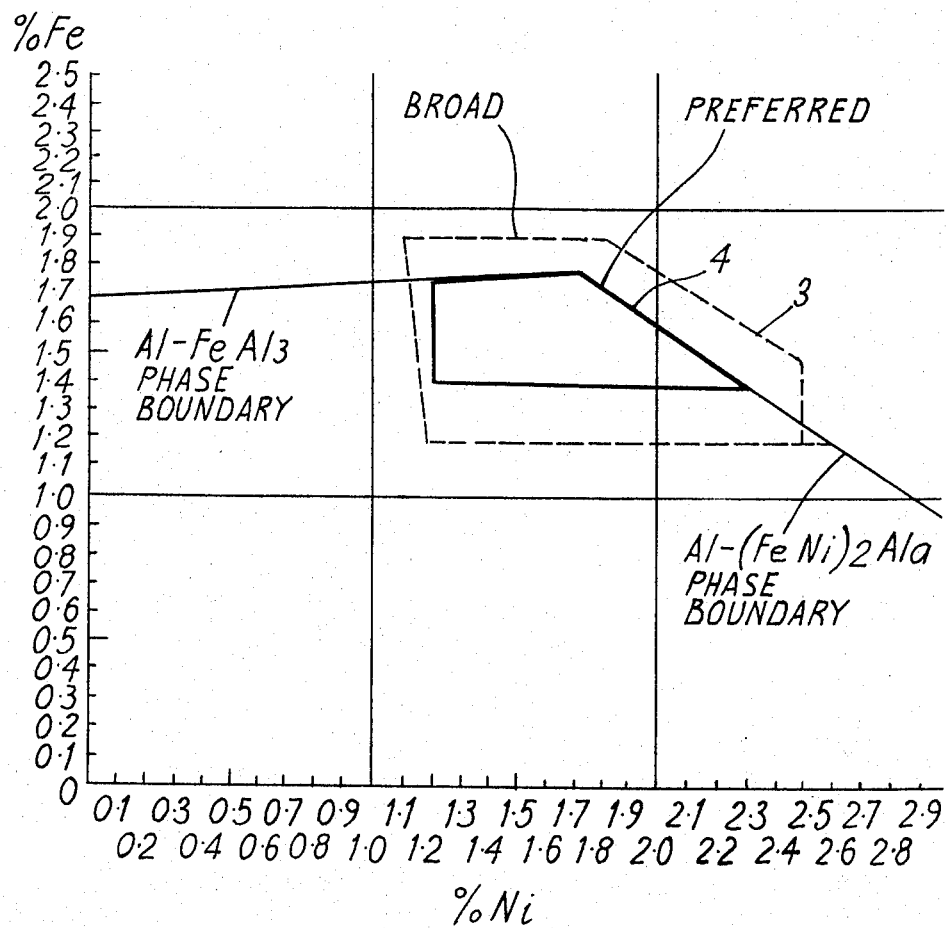
FIG. 8 is a graph illustrating general and preferred composition ranges for the system Al-Fe-Ni.

In FIG. 8, the boundaries of general and preferred ranges of compositions for the system Al-Fe-Ni are similarly defined by the outer and inner solid lines 3 and 4 in relation to the boundaries between the phases Al,$FeAl_3$ and Al, $(Fe,Ni)_2Al_9$.

Figure 9:
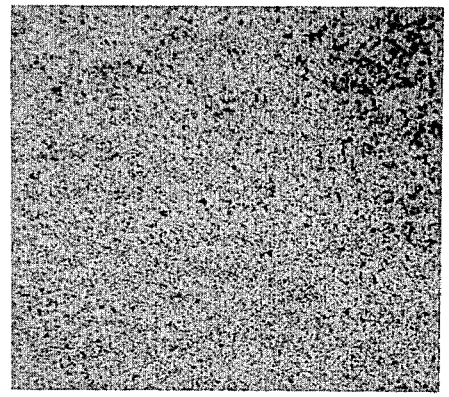
FIG. 9 is a photomicrograph of a cast slab of an Al-Fe-Mn-Cu alloy produced by rapid chilling.
Figure 10:
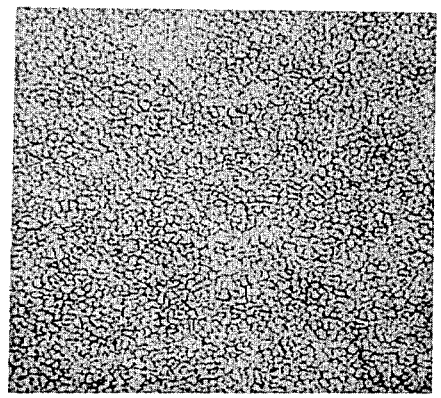
FIG. 10 is a photomicrograph of a product obtained by cold-rolling the slab of FIG. 9.

While it is preferred in the process of the present invention to start from cast material in which the rod-like intermetallics have been developed by coupled growth of the eutectic structure, it is also possible to start from cast material in which there is a large volume of aluminum dendrites. As already stated, the cast material may include these large volumes of Al dendrites when the solidification is very rapid and the dendrites are sufficiently small. The accompanying FIG. 9 is a photomicrograph at 500 × magnification illustrating an acceptable structure as a cast slab of the Al-Fe-Mn-Cu alloy of Example 3 produced by exceptionally rapid chilling. The light areas in this photomicrograph are individual aluminum dendrites of a dimension of about 3 – 5 microns and the dark areas consist of clusters of very fine rod-like intermetallics of a diameter of about 0.2 microns. FIG. 10 is a photomicrograph of the same material after being cold-rolled from a thickness of 0.280 inch down to a thickness of 0.040 inch. The alloy was cast between a pair of chilled steel rolls in a machine produced by Hunter Engineering Company. In the following Example 9 there are set forth typical conditions for the production of the material of FIGS. 9 and 10, together with its mechanical properties.

EXAMPLE 9

| | |
|---|---|
| Sheet produced from slab cast by a twin steel roll caster. | |
| Composition: | 1.65% Fe, 0.90% Mn, 0.24% Cu, 0.12% Si, others less than 0.01% each, balance Al. |
| Casting procedure: | as 33 in. wide × 0.280 in. thick continuous slab. Casting rate: 33 in./min. Metal temperature 710° C. |
| Fabrication: | A As-cast slab cold-rolled to 0.040 in. and 0.012 in. sheet.<br>B As-cast slab cold-rolled to 0.150 in.; annealed at 350° C for 2 hrs.; cold-rolled to 0.040 in. and 0.012 in. sheet.<br>C As-cast slab cold-rolled to 0.150 in.; annealed at 500° C for 2 hrs.; cold-rolled to 0.040 in. and 0.012 in. sheet. |
| Structure: | Ingot consisted of very fine aluminum dendrites, ~ 5 micron cell size, surrounded by very fine intermetallic rods, ~ 0.2 micron average diameter. The rods were segmented and the particles dispersed in the sheet during cold-rolling to 0.040 in. Particle size increased with annealing temperature but remained less than 1 micron in diameter. |

Tensile Properties - % Elongation in 2 in. gauge

| Fabrication Schedule and Gauge (in.) | As-Rolled | | | Final Anneal at 350° C — 2 hours. | | | Final Anneal at 400° C — 2 hours | | |
|---|---|---|---|---|---|---|---|---|---|
| | U.T.S. (ksi) | Y.S. (ksi) | El. | U.T.S. (ksi) | Y.S. (ksi) | El. | U.T.S. (ksi) | Y.S. (ksi) | El. |
| A. 0.040 | 47 | 43 | 5 | 35 | 13 | 6 | 30 | 25 | 13 |
| 0.012 | 52 | 45 | 4 | 35 | 32 | 7 | 29 | 26 | 12 |
| B. 0.040 | 42 | 35 | 6 | 34 | 30 | 10 | 30 | 26 | 15 |
| 0.012 | 44 | 36 | 5 | 34 | 31 | 7 | 31 | 27 | 14 |
| C. 0.040 | 36 | 31 | 6 | 22 | 16 | 22 | 21 | 10 | 28 |
| 0.012 | 37 | 31 | 5 | 24 | 20 | 25 | 22 | 16 | 23 |

Although it is quite simple to cast a rectangular aluminum alloy rolling ingot of up to about 6 in. thickness by direct-chill continuous casting under conditions which will lead to substantially complete coupled growth in the preferred eutectic alloys of the present invention, it is less easy to achieve the same result in the case of the much thicker ingots commonly employed in the production of aluminum alloy sheet products. However, since thick ingots, e.g. 18 in. thickness, undergo heavy reductions on conversion to sheet, quite large dendrites are permissible in the cast alloy.

EXAMPLE 10

| | |
|---|---|
| Sheet Produced from Thick D.C. Ingot | |
| Composition: | 1.6% Fe, 0.4% Mn, 1.4% Ni, 0.1% Si, 0.02% Ga (impurity), others less than 0.01% each, balance Al. |
| Casting procedure: | Ingot cast by D.C. process using large glass cloth distributor in mold to reduce turbulence in an attempt to increase temperature gradient in metal sump. Metal temperature - 735° C, casting speed - 3 in./min. Ingot dimensions - 18 in. thick × 54 in. wide × 100 in. long. |
| Fabrication | Ingot preheated to 475° C and hot-rolled from 18 in. to 0.125 in., cold-rolled 0.125 in. to 0.040 in. then given a final partial anneal at 315° C for 2 hours. |
| Structure: | Ingot contained large areas of rod-like (Fe,Ni)$_2$Al$_9$ eutectic plus about 40 vol. % of primary aluminum dendrites. The dendrite cell size about 20 microns. Rod diameter averaged about 0.4 microns. During deformation the intermetallic rods were segmented and the particles dispersed. Particle-free zones from the original aluminum dendrites were not detectable in the 0.040 in. sheet. |

| Material | Mechanical Properties | | | |
|---|---|---|---|---|
| | U.T.S. (ksi) | Y.S. (ksi) | Elong. (%) | Erichsen (in.) |
| 0.040 in. sheet after 315° C partial anneal | 26.4 | 25.3 | 22 | 0.38 |

Stated in general, alloys to which the instant process is applicable include those alloys having a major content of aluminum and a minor content of one or more alloying elements in proportions of not more than about 10% each, about 20% total, and capable of forming intermetallics that are compounds of aluminum and the principal alloying element or elements and are formed from the melt in a casting operation.

The coarse primary intermetallic particles referred to above (as distinguished from the rod-like intermetallics and intermetallic particles obtained by fragmentation of these rods incident to working) are generally in the form of faceted polyhedra, resulting from nucleation ahead of the solidification front in a mass of alloy being cast, and range upwardly in size from about 3 microns, and typically upwards of 10 microns.

The spacing between intermetallic particles, in the wrought products of the present invention, is determined by the volume fraction of such intermetallics in the product and by the average particle diameter (as defined above), where the particles are substantially uniformly dispersed.

To determine the intermetallic rod diameter in the as-cast ingot a representative plane section is taken normal to the solidification direction (direction of heat flow). This section is mechanically ground and polished according to standard practices as described in the article "Metallographic Technique for Aluminum Alloys" pages 120 to 129, *Metals Handbook*, eighth edition, Vol. 8, published by the American Society for Metals (1973). The polished section is etched with: ½ vol. % hydrofluoric acid (48%) in water, for five to twenty seconds.

When the rod diameters are greater than about 0.3 microns the diameter of a rod cross-section can be measured directly in a microscope using an eyepiece micrometer at a magnification of 1000X. Similarly, rods of smaller diameter can be measured by viewing the polished section with a scanning electron microscope at about 5000X magnification. Since the rods are usually somewhat irregular in cross-section and the diameter usually varies from the edge of the center of a eutectic cell the determination of the average or mean diameter by direct measurement is painstaking and lengthy. An easier and adequate method is to count the average number of intermetallic rods per unit area that intersect the polished surface on a micrography of the above mentioned cross-section, and calculate the average diameter using the formula:

$$D = 1.1 \sqrt{V/Nr}$$

where:
 D = average rod diameter
 V = volume fraction of intermetallic phase (0.05 to 0.20)
 Nr = average number of rods per unit area.

The above formula expresses the rod diameter in terms of the diameter of a circle of equal area.

To determine the average particle diameter in wrought products, two representative plane sections are taken through the thickness and at right angles to each other. These sections are polished and etched as described above. The average particle diameter, as stated above, is determined by counting the number of particles present in unit area in micrographs of these cross-sections, ignoring coarse primary intermetallic particles and fine particles that are precipitated from solid solution.

When essentially all the particles are greater than about 0.3 microns diameter a convenient method of determining the number of particles per unit area is to take representative optical photomicrographs at 1000X magnification and count the number of particles in a total of 100 square centimeters on the photomicrographs. The number of particles per square micron area on the sample is equal to the total number of particles counted on the photomicrographs, divided by 10,000 (100 square cm. area on a 1000X micrograph equals a 10,000 square micron area on the sample).

The average particle diameter is then given adequately by the formula set forth above for determining the value d.

When particles are less than about 0.25 microns in size they are not resolvable optically and the particle count, on a 10,000 square micron area on the sample, is carried out using micrographs taken at about 5000X magnification by a scanning electron microscope.

The volume percent of intermetallics produced by the eutectic reaction is calculated from the known concentration of alloying elements in the phase and the known density of the phase. This informtion is obtainable from phase diagrams and tabulated data in the following two references: *Metals Handbook*, 8th edition, Vol. 8, A.S.M. (1973); and, *Aluminum* Vol. 1, Ed. K. R. Van Horn, A.S.M. (1967).

When the above information, or reasonable estimates, are not available the volume percent is measured on representative polished sections of as-cast ingot using an image analyzing microscope.

Where the rods (in the as-cast ingot) exhibit differences in cross-sectional dimensions and may be considerably branched the useful results of the invention are still attainable.

Although in general best results are obtained when the average diameter of the rods (in an as-cast ingot) is in a range of about 0.1 to 1.5 microns, in some cases useful results may be achieved with rods of somewhat smaller average diameter, e.g. down to about 0.05 micron, so long as the resultant average particle diameter is at least about 0.1 micron.

In the specific case of Al-Fe-Mn alloys, as described above, it is found that for particular applications the broad range of proportions of Fe and Mn may be extended, beyond the area shown in broken line 1 in FIG. 7, to embrace the range of compositions within the limits 0.3 – 1.2% Mn, 1.4 – 2.0% Fe.

It is to be understood that the invention is not limited to the features and embodiments hereinabove specifically set forth, but may be carried but in other ways without departure from its spirit.

I claim:

1. A method of producing dispersion-strengthened aluminum alloy products which comprises
    a. casting an alloy having a major content of aluminum and a minor content of at least one alloying element, the content of alloying elements in said alloy being not more than about 10% each, not more than about 20% total, and lying between 20% less than and 10% more than the value of a eutectic composition, said alloy being castable to develop 5.0–20% by volume of intermetallics that are at least one compound of aluminum and at least one alloying element present in said alloy and are formed from the melt in a casting operation, said casting step comprising casting said alloy, by a continuous casting process, at a growth rate of at least 1 cm/minute at the solidification front, for producing a mass of cast aluminum alloy which includes, in an aluminum matrix, 5.0–20% by volume of unaligned intermetallic rods of an average diameter of 0.1–1.5 microns, and for suppressing the growth of coarse primary intermetallic particles ranging upwardly of 3 microns in diameter such that said mass of cast alloy contains not more than 2% by volume of said coarse primary intermetallic particles, and
    b. working the cast aluminum alloy to effect at least 60% reduction thereof for breaking up said intermetallic rods into intermetallic particles, and for dispersing said particles throughout the alloy mass, said rods being broken up by the working step into particles having an average particle diameter ranging between about 0.1 micron and about 2 microns, such as to enable the particles to generate and stabilize a dislocation cell of not more than about 3 microns in magnitude during cold deformation and to hold a grain diameter of not more than about 3 microns after annealing and also to hold high angle misorientation boundaries in the aluminum matrix, thereby to provide a dispersion-strengthened alloy product.

2. A method according to claim 1 in which the aluminum alloy is cast by the direct-chill continuous casting process at a growth rate of at least 1 cm/minute at the solidification front while maintaining a temperature gradient of at least 5° C/cm in the liquid metal pool in the immediate vicinity of the solidification front.

3. A method according to claim 1 in which the cast aluminum alloy mass contains between 5.0% and about 12% by volume of said intermetallic rods.

4. A method according to claim 1 in which the cast aluminum alloy mass is subjected to an initial reduction by hot working, followed by cold working to further reduce the hot worked mass by at least a further 10%.

5. A method according to claim 4 in which the hot worked mass is reduced by at least a further 50% by cold working.

6. A method according to claim 4, in which the cold worked alloy is subjected to a final heat treatment at a temperature in the range of 230° – 450° C.

7. A method according to claim 1 in which the aluminum alloy is a eutectic composition containing as principal alloying elements at least two alloying elements selected from the group consisting of Fe in an amount of at least 1.2%, Mn in an amount of at least 0.3%, Ni in an amount of at least 1.1%, Si in an amount of at least 0.5%, said alloying elements being present in such amounts as to provide not less than 5.0 percent by volume and not more than 20 percent by volume of intermetallic particles, said alloy also containing up to 1.5% total (1.0% max. each) of Zn, Li, Cu and Mg and a total of up to 0.15% (0.1% max. each) others, balance Al.

8. A method according to claim 1 in which the alloy includes as principal alloying elements Fe and Mn within the coordinates 1.9% Fe, 0.3% Mn; 2.0% Fe, 0.8% Mn; 1.4% Fe, 1.2% Mn; 1.4% Fe, 0.6% Mn, the alloy also containing up to 1.5% total (up to 1.0% max. each) of Zn, Li, Cu, Mg and Si, up to 1.0% total (up to 0.3% max. each) other elements, balance Al.

9. A method according to claim 1 in which the alloy includes as principal alloying elements Fe and Ni, within the coordinates 1.9% Fe, 1.1% Ni; 1.9% Fe, 1.8% Ni; 1.5% Fe, 2.5% Ni; 1.2% Fe, 2.5% Ni; 1.2% Fe, 1.2% Ni, the alloy also containing up to 1.5% Mn, up to 1.5% total (up to 1.0% max. each) of Zn, Li, Cu, Mg and Si, up to 1.0% total (up to 0.3% max. each) of other elements, balance Al.

10. A method according to claim 1 in which the alloy includes as principal alloying elements Fe and Ni within the coordinates 1.7% Fe, 1.2% Ni; 1.8% Fe, 1.7% Ni; 1.4% Fe, 2.3% Ni; 1.4% Fe, 1.2% Ni, the alloy also containing 0.3 – 0.6% Mn, up to 0.5% Cu, up to 0.5% Mg, up to 0.3% Si, up to 0.15% total (up to 0.1% max. each) other elements, balance Al.

11. A wrought aluminum alloy product, constituted of an alloy having a major content of aluminum and containing at least two alloying elements selected from the group consisting of Fe in an amount of at least 1.2%, Ni in an amount of at least 1.1%, Mn in an amount of at least 0.3%, and Si in an amount of at least 0.5%, subject to the proviso that when both Fe and Ni are selected up to 0.5% of the combined Fe and Ni content may be substituted by an equal amount of Co, the content of alloying elements present in said alloy being not more than about 10% each, not more than about 20% total, and lying between 20% less than and 10% more than the value of a eutectic composition, said alloy being castable to develop 5.0–20% by volume of intermetallics that are at least one compound of aluminum and at least one alloying element present in said alloy and are formed from the melt in a casting operation, said product containing, in an aluminum matrix, not less than 5.0 percent by volume and not more than about 20 percent by volume of dispersed intermetallic particles having an average particle diameter ranging between about 0.1 microns and about 2 microns which are fragments of unaligned intermetallic rods developed by casting and having an average diameter of 0.05–1.5 microns and broken up by working, the size range of said dispersed intermetallic particles being such as to enable the particles to generate and stabilize a dislocation cell of not more than about 3 microns in magnitude during cold deformation and to hold a grain diameter of not more than about 3 microns after annealing and also to hold high angle misorientation boundaries in the aluminum matrix, thereby to provide a dispersion strengthened alloy product, said product containing not more than 2% by volume of coarse primary intermetallic particles ranging upwardly of 3 microns in diameter.

12. A wrought aluminum alloy product incorporating 5.0–20% by volume of dispersed intermetallic particles having an average particle diameter ranging between 0.1 and 2 microns, said alloy containing not more than 2% by volume of coarse intermetallic particles ranging upwardly of 3 microns in diameter and containing as principal alloying constituents at least two alloying elements selected from the group consisting of Fe in an amount of at least 1.2%, Ni in an amount of at least 1.1%, Mn in an amount of at least 0.3%, and Si in an amount of at least 0.5%, subject to the proviso that when both Fe and Ni are selected up to 0.5% of the combined Fe and Ni content may be substituted by an equal amount of Co, said principal alloying constituents being present in a total amount to supply not less than 5.0 volume percent and not more than about 20 volume percent of intermetallic phases, said alloy also containing up to 1.5% total (1.0% max. each) Zn, Li, Cu and Mg and up to a total of 1.0% max. (0.3% max. each) other elements, the content of said principal alloying constituents in said alloy lying between 20% less than and 10% more than the value of a eutectic composition, said dispersed intermetallic particles being fragments of unaligned intermetallic rods developed by casting and having an average diameter of 0.05–1.5 microns and broken up by working, the size range of said dispersed intermetallic particles being such as to enable the particles to generate and stabilize a dislocation cell of not more than about 3 microns in magnitude during cold deformation and to hold a grain diameter of not more than about 3 microns after annealing and also to hold high angle misorientation boundaries in the aluminum matrix, thereby to provide a dispersion strengthened alloy product.

13. A wrought aluminum alloy product according to claim 12 in which the total content of Fe and Ni is 90 – 100% of an eutectic.

14. A wrought aluminum alloy product according to claim 12 in which the total content of Fe and Mn is 90 – 100% of an eutectic.

15. A wrought aluminum alloy product according to claim 12 in which the alloy includes as principal alloying elements Fe and Mn within the coordinates 1.9% Fe, 0.3% Mn; 2.0% Fe, 0.8% Mn; 1.4% Fe, 1.2% Mn; 1.4% Fe, 0.6% Mn, the alloy also containing up to 1.5% total (up to 1.0% max. each) of Zn, Li, Cu, Mg and Si, up to 1.0% total (up to 0.3% max. each) other elements, balance Al.

16. A wrought aluminum alloy product according to claim 12 in which the alloy includes as principal alloying elements Fe and Ni within the coordinates 1.9% Fe, 1.1% Ni; 1.9% Fe, 1.8% Ni; 1.5% Fe, 2.5% Ni; 1.2% Fe, 2.5% Ni; 1.2% Fe, 1.2% Ni, the alloy also containing up to 1.5% total (up to 1.0% max. each) of Zn, Li, Cu, Mg, Si, up to 1.0% total (up to 0.3% max. each) of other elements, balance Al.

17. A wrought aluminum alloy product according to claim 12 in which the alloy includes as principal alloying elements Fe and Ni within the coordinates 1.7% Fe, 1.2% Ni; 1.8% Fe, 1.7% Ni; 1.4% Fe, 2.3% Ni; 1.4% Fe, 1.2% Ni, the alloy also containing 0.3 – 0.6% Mn, up to 0.5% Cu, up to 0.5% Mg, up to 0.3% Si, up to 0.15% total (up to 0.1% max. each) other elements, balance Al.

18. A wrought aluminum alloy product according to claim 12 in the form of a sheet in the thickness range of 0.1 – 0.0004 inch.

19. A method according to claim 1 in which the cast aluminum alloy mass is subjected to at least 60% reduction by cold working.

20. A method according to claim 19 in which the cold worked aluminum alloy is subjected to a final heat treatment at a temperature in the range of 230° – 450° C.

21. A method according to claim 7 in which the aluminum alloy contains Fe and Ni as principal alloying elements and up to 0.5% of the combined content of Fe and Ni is replaced by an equal amount of Co.

22. A method according to claim 1 in which the average diameter of the intermetallic rods is in the range of 0.1 – 0.8 microns.

23. A method according to claim 1 in which the aluminum alloy includes Fe, Mn and Si as principal alloying elements within the ranges of 1.4 – 2.2% Fe, 0.5 – 2.0% Si, 0.1 – 1.0% Mn, the alloy also containing up to 1.5% total (up to 1.0% max. each) of Zn, Cu, Li and Mg and up to 1.0% total (0.3% max. each) other elements, balance Al.

24. A method according to claim 1 in which the aluminum alloy includes Fe, Mn and Si as principal alloying elements within the ranges of 1.7 – 2.0% Fe, 0.5 – 1.0% Si, 0.5 – 0.9% Mn, the alloy also containing up to 0.3% Cu, up to 0.3% Mg, up to 0.15% total (0.1% max. each) other elements, balance Al.

25. A method according to claim 1 in which the aluminum alloy includes Ni and Mn as principal alloying elements within the ranges 4.5 – 6.5% Ni and 0.3 – 2.5% Mn, the alloy also including up to 1.5% total (1.0% max. each) Zn, Cu, Li, Mg, Fe and Si and up to 1.0% total (0.3% max. each) other elements, balance Al.

26. A method according to claim 1 in which the aluminum alloy includes Ni and Mn as principal alloying elements within the ranges of 5.5 – 6.0% Ni and 1.0 – 2.0% Mn, up to 0.3% each Cu, Mg, Fe and Si and up to 0.15% total (0.1% max. each) other elements, balance Al.

27. A method according to claim 1 further comprising casting the aluminum alloy at a growth rate of at least 1 cm/minute at the solidification front while maintaining a temperature gradient of at least 5° C/cm in the liquid metal in the immediate vicinity of the solidification front.

28. A wrought aluminum alloy product according to claim 11 which includes Fe, Mn and Si as principal alloying elements within the ranges of 1.4 – 2.2% Fe, 0.5 – 2.0% Si, 0.1 – 1.0% Mn, the alloy also containing up to 1.5% total (up to 1.0% max. each) of Zn, Cu, Li, and Mg and up to 1.0% total (0.3% max. each) other elements, balance Al.

29. A wrought aluminum alloy product according to claim 11 which includes Fe, Mn and Si as principal alloying elements within the ranges of 1.7 – 2.0% Fe, 0.5 – 1.0% Si, 0.5 – 0.9% Mn, the alloy also containing up to 0.3% Cu, up to 0.3% Mg, up to 0.15% total (0.1% max. each) other elements, balance Al.

30. A wrought aluminum alloy product according to claim 11 which includes Ni and Mn as principal alloying elements within the ranges 4.5 – 6.5% Ni and 0.3 – 2.5% Mn, the alloy also including up to 1.5% total (1.0% max. each) Zn, Cu, Li, Mg, Fe and Si and up to 1.0% total (0.3% max. each) other elements, balance Al.

31. A wrought aluminum alloy product according to claim 11 which includes Ni and Mn as principal alloying elements within the ranges of 5.5 – 6.0% Ni and 1.0 – 2.0% Mn, up to 0.3% each Cu, Mg, Fe and Si and up to 0.15% total (0.1% max. each) other elements, balance Al.

32. A wrought aluminum alloy product according to claim 11 in the form of a sheet in the thickness range of 0.1 – 0.0004 inch.

33. A method according to claim 1 in which the alloy includes as principal alloying elements Fe and Mn in the proportion of 1.4 – 2.0% Fe and 0.3 – 1.2% Mn.

34. A method according to claim 1 for producing a dispersion-strengthened alloy sheet product, wherein the working step comprises rolling the cast alloy to reduce it to sheet.

35. A wrought aluminum alloy product, constituted of an alloy having a major content of aluminum and a minor content of nickel lying between 20% less than and 10% more than the value of a eutectic composition, said alloy being castable to develop 5.0–20% by volume of intermetallics that are at least one compound of aluminum and nickel and are formed from the melt in a casting operation, said product containing, in an aluminum matrix, not less than 5.0 percent by volume and not more than about 20 percent by volume of dispersed intermetallic particles having an average particle diameter ranging between about 0.1 microns and about 2 microns which are fragments of unaligned intermetallic rods developed by casting and having an average diamete of 0.05–1.5 microns and broken up by working, the size range of said dispersed intermetallic particles being such as to enable the particles to generate and stabilize a dislocation cell of not more than about 3 microns in magnitude during cold deformation and to hold a grain diameter of not more than about 3 microns after annealing and also to hold high angle misorientation boundaries in the aluminum matrix, thereby to provide a dispersion strengthened alloy product, said product containing not more than 2% by volume of coarse primary intermetallic particles ranging upwardly of 3 microns in diameter.

* * * * *